US009412833B2

(12) United States Patent
Chau et al.

(10) Patent No.: US 9,412,833 B2
(45) Date of Patent: Aug. 9, 2016

(54) NARROW SEMICONDUCTOR TRENCH STRUCTURE

(75) Inventors: The-Tu Chau, San Jose, CA (US); Hoang Le, San Jose, CA (US); Kuo-In Chen, Los Altos, CA (US)

(73) Assignee: Vishay-Siliconix, Santa Clara, CA (US)

( * ) Notice: Subject to any disclaimer, the term of this patent is extended or adjusted under 35 U.S.C. 154(b) by 1530 days.

(21) Appl. No.: 12/030,809

(22) Filed: Feb. 13, 2008

(65) Prior Publication Data

US 2009/0104751 A1    Apr. 23, 2009

Related U.S. Application Data

(62) Division of application No. 11/373,630, filed on Mar. 9, 2006.

(60) Provisional application No. 60/661,198, filed on Mar. 11, 2005.

(51) Int. Cl.
*H01L 29/66*    (2006.01)
(52) U.S. Cl.
CPC ................. *H01L 29/66181* (2013.01)
(58) Field of Classification Search
CPC ............ H01L 27/11521; H01L 27/115; H01L 21/76229; H01L 27/11524
USPC ............................ 438/637, 420; 257/E21.546
See application file for complete search history.

(56) References Cited

U.S. PATENT DOCUMENTS

| 4,131,524 A | 12/1978 | Gieles |
| 4,478,655 A | 10/1984 | Nagakubo et al. |
| 4,605,919 A | 8/1986 | Wilner |
| 4,660,068 A | 4/1987 | Sakuma et al. |
| 4,758,531 A | 7/1988 | Beyer et al. |
| 4,799,990 A | 1/1989 | Kerbaugh et al. |
| 4,835,585 A | 5/1989 | Panousis |
| 4,843,025 A * | 6/1989 | Morita ......................... 438/388 |
| 4,857,986 A | 8/1989 | Kinugawa |
| 4,939,557 A | 7/1990 | Pao et al. |

(Continued)

FOREIGN PATENT DOCUMENTS

| EP | 0238749 | 10/1986 |
| EP | 0354449 | 2/1990 |

(Continued)

OTHER PUBLICATIONS

Application As Filed; U.S. Appl. No. 11/373,630; The-Tu Chau; et al., filed Feb. 13, 2008.

(Continued)

*Primary Examiner* — Tony Tran

(57) ABSTRACT

Systems and methods for narrow semiconductor trench structures. In a first method embodiment, a method for forming a narrow trench comprises forming a first layer of insulating material on a substrate and creating a trench through the first layer of insulating material and into the substrate. A second insulating material is formed on the first layer and on exposed portions of the trench and the second insulating material is removed from the first layer of insulating material and the bottom of the trench. The trench is filled with an epitaxial material and the first layer of insulating material is removed. A narrow trench is formed by the removal of remaining portions of the second insulating material.

7 Claims, 4 Drawing Sheets

(56) References Cited

U.S. PATENT DOCUMENTS

| | | |
|---|---|---|
| 5,087,586 A | 2/1992 | Chan et al. |
| 5,182,233 A | 1/1993 | Inoue |
| 5,366,914 A | 11/1994 | Takahashi et al. |
| 5,602,424 A | 2/1997 | Tsubouchi et al. |
| 5,814,858 A | 9/1998 | Williams |
| 5,963,822 A | 10/1999 | Saihara et al. |
| 5,965,904 A | 10/1999 | Ohtani et al. |
| 6,059,981 A | 5/2000 | Nakasuji |
| 6,153,896 A | 11/2000 | Omura et al. |
| 6,180,966 B1 | 1/2001 | Kohno et al. |
| 6,245,615 B1 | 6/2001 | Noble et al. |
| 6,359,308 B1 | 3/2002 | Hijzen et al. |
| 6,373,100 B1 | 4/2002 | Pages et al. |
| 6,436,791 B1 | 8/2002 | Lin et al. |
| 6,483,171 B1 | 11/2002 | Forbes et al. |
| 6,495,883 B2 | 12/2002 | Shibata et al. |
| 6,580,154 B2 | 6/2003 | Noble et al. |
| 6,605,843 B1 | 8/2003 | Krivokapic et al. |
| 6,621,132 B2 | 9/2003 | Onishi et al. |
| 6,630,389 B2 | 10/2003 | Shibata et al. |
| 6,710,403 B2 | 3/2004 | Sapp |
| 6,903,393 B2 | 6/2005 | Ohmi et al. |
| 6,919,610 B2 | 7/2005 | Saitoh et al. |
| 6,924,198 B2 | 8/2005 | Williams et al. |
| 6,960,821 B2 | 11/2005 | Noble et al. |
| 6,967,112 B2 | 11/2005 | Maa et al. |
| 6,995,439 B1 | 2/2006 | Hill et al. |
| 7,217,606 B2 | 5/2007 | Forbes et al. |
| 7,348,244 B2 | 3/2008 | Aoki et al. |
| 7,361,952 B2 | 4/2008 | Miura et al. |
| 7,663,195 B2 | 2/2010 | Ohmi et al. |
| 7,928,518 B2 | 4/2011 | Ohmi et al. |
| 8,409,954 B2 | 4/2013 | Chau et al. |
| 2001/0026006 A1 | 10/2001 | Noble et al. |
| 2002/0104988 A1 | 8/2002 | Shibata et al. |
| 2002/0155685 A1 | 10/2002 | Sakakibara |
| 2003/0008483 A1 | 1/2003 | Sato et al. |
| 2003/0073271 A1* | 4/2003 | Birner et al. ............... 438/197 |
| 2003/0082873 A1* | 5/2003 | Zambrano ............... 438/238 |
| 2003/0102564 A1 | 6/2003 | Darwish |
| 2004/0155287 A1 | 8/2004 | Omura et al. |
| 2004/0161886 A1 | 8/2004 | Forbes et al. |
| 2004/0185665 A1 | 9/2004 | Kishimoto et al. |
| 2004/0198003 A1 | 10/2004 | Yeo et al. |
| 2005/0026369 A1 | 2/2005 | Noble et al. |
| 2005/0029585 A1 | 2/2005 | He et al. |
| 2005/0079678 A1* | 4/2005 | Verma et al. ............... 438/312 |
| 2005/0224890 A1 | 10/2005 | Bernstein et al. |
| 2005/0250276 A1 | 11/2005 | Heath et al. |
| 2005/0253193 A1* | 11/2005 | Chen et al. ............... 257/347 |
| 2005/0277278 A1 | 12/2005 | Maleville et al. |
| 2006/0046419 A1* | 3/2006 | Sandhu et al. ............... 438/386 |
| 2006/0081919 A1 | 4/2006 | Inoue et al. |
| 2006/0091456 A1 | 5/2006 | Montgomery |
| 2006/0108635 A1 | 5/2006 | Bhalla et al. |
| 2006/0128100 A1 | 6/2006 | Aoki et al. |
| 2006/0138538 A1 | 6/2006 | Ohmi et al. |
| 2006/0292825 A1 | 12/2006 | Lerner |
| 2007/0034911 A1 | 2/2007 | Kao |
| 2007/0048966 A1 | 3/2007 | Chau et al. |
| 2008/0099344 A9* | 5/2008 | Basol et al. ............... 205/668 |
| 2008/0157281 A1 | 7/2008 | Chau et al. |
| 2009/0104751 A1 | 4/2009 | Chau et al. |
| 2010/0032857 A1 | 2/2010 | Izadnegahdar et al. |
| 2010/0072519 A1 | 3/2010 | Ohmi et al. |

FOREIGN PATENT DOCUMENTS

| | | |
|---|---|---|
| EP | 1628337 | 2/2006 |
| JP | 58100441 | 6/1983 |
| JP | 58-168258 | 10/1983 |
| JP | 58-197839 | 11/1983 |
| JP | 61022630 | 1/1986 |
| JP | 61-256739 | 11/1986 |
| JP | 62-298130 | 12/1987 |
| JP | 62298130 | 12/1987 |
| JP | 63284832 | 11/1988 |
| JP | S63291449 | 11/1988 |
| JP | 401008672 | 1/1989 |
| JP | 02-035736 | 2/1990 |
| JP | 02-058248 | 2/1990 |
| JP | S63-284832 | 11/1998 |
| JP | 2002231945 | 8/2002 |
| JP | 2004056003 | 2/2004 |
| JP | 2004146626 | 5/2004 |
| JP | 2004356114 | 12/2004 |
| KR | 1020040036958 | 4/2004 |
| WO | 2004105116 | 12/2004 |
| WO | 2006058210 | 6/2006 |

OTHER PUBLICATIONS

Nakamura et al., Effects of Selecting Channel Direction in Improving Performance of Sub-100nm MOSFETs Fabricated on (110) Surface Si Substrate, Japanese Journal of Applied Physics, vol. 43, No. 4B, Apr. 2004, pp. 1723-1728. cited by applicant.

Peter Van Zant, Microchip Fabrication, 2000, McGraw-Hill Publication, Fourth Edition, p. 32.

* cited by examiner

NARROW SEMICONDUCTOR TRENCH STRUCTURE

RELATED APPLICATIONS

This Application claims benefit of U.S. Provisional Patent Application Ser. No. 60/661,198, filed Mar. 11, 2005, to Chau et al., which is hereby incorporated herein by reference in its entirety.

This is a Divisional Application of, and claims benefit to, co-pending U.S. patent application Ser. No. 11/373,630, filed Mar. 9, 2006, to Chau et al., which is hereby incorporated herein by reference in its entirety.

TECHNICAL FIELD

Embodiments of the present invention relate to the fields of manufacturing semiconductors, and more particularly to systems and methods for forming narrow trench structures in semiconductors.

BACKGROUND

The inexorable decrease of feature size, e.g., critical dimension, of modern semiconductor devices is increasing semiconductor density in a wide variety of types of semiconductor devices. However, conventional methods for fabricating trenches in semiconductors, for example, as commonly used in power semiconductors and memory semiconductors, e.g., dynamic random access memory, are challenged to construct ever-narrower trenches corresponding to such decreases in semiconductor process critical dimension. In addition, some semiconductor applications have power density and/or voltage requirements that mitigate against decreasing process dimensions.

SUMMARY

Therefore, there is a need for systems and methods for narrow semiconductor trench structures.

Accordingly, systems and methods for narrow semiconductor trench structures are disclosed. In a first method embodiment, a method for forming a narrow trench comprises forming a first layer of insulating material on a substrate and creating a trench through the first layer of insulating material and into the substrate. A second insulating material is formed on the first layer and on exposed portions of the trench and the second insulating material is removed from the first layer of insulating material and the bottom of the trench. The trench is filled with an epitaxial material and the first layer of insulating material is removed. A narrow trench is formed by the removal of remaining portions of the second insulating material.

In accordance with another embodiment of the preset invention, a semiconductor device includes a trench characterized as having a width dimension of less than one tenth of the critical dimension of the semiconductor process used to manufacture the semiconductor device.

In accordance with another method embodiment of the preset invention, a first trench in a semiconductor substrate is formed. A first layer of material is applied adjacent to and parallel to an edge of the first trench. A second layer of material is applied adjacent to and parallel to an edge of the first layer of material. The first layer of material is removed while retaining the second layer of material to form a narrow trench.

BEST MODES FOR CARRYING OUT THE INVENTION

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Narrow Semi Conductor Trench Structure

Conventional semiconductor processing techniques are generally unable to produce a vertical trench narrower, e.g., of less width, than the critical dimension (CD) of a semiconductor process. Usually, a minimum trench width is determined by the lithographic process capability.

Utilizing a process with a smaller critical dimension in order to create narrower trenches is not always commercially feasible. For example, at any given point in time there is a minimum process geometry available. Further, there are many cases in which an improved process geometry is prohibitively expensive for its beneficial return, but in which case narrower trenches would be advantageous none-the-less.

Figure 1:
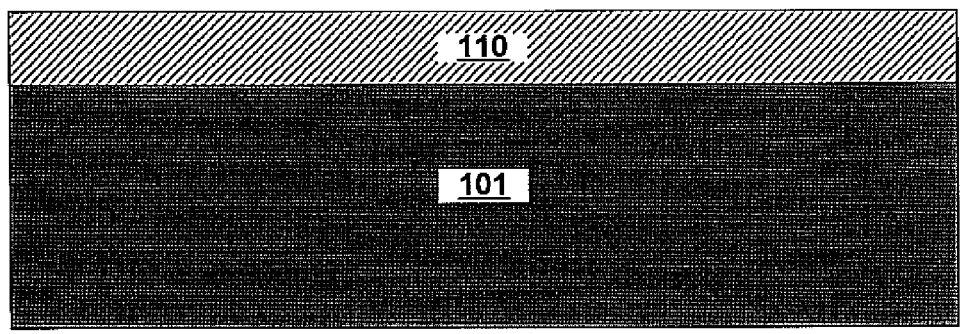
FIGS. 1, 2, 3, 4, 5 and 6 illustrate side sectional views of a wafer in intermediate stages of forming a narrow trench, in accordance with embodiments of the present invention.

FIG. 1 illustrates a side sectional view of a wafer in an intermediate stage of forming a narrow trench, in accordance with embodiments of the present invention. FIG. 1 illustrates a first insulating layer 110, for example oxide or nitride, that has been grown on top of a substrate 101. It is appreciated that embodiments of the present invention are well suited to a wide variety of substrates, e.g., Silicon or Germanium, as well as to a wide variety of doping levels, including formation in and/or on epitaxial layers.

Figure 2:
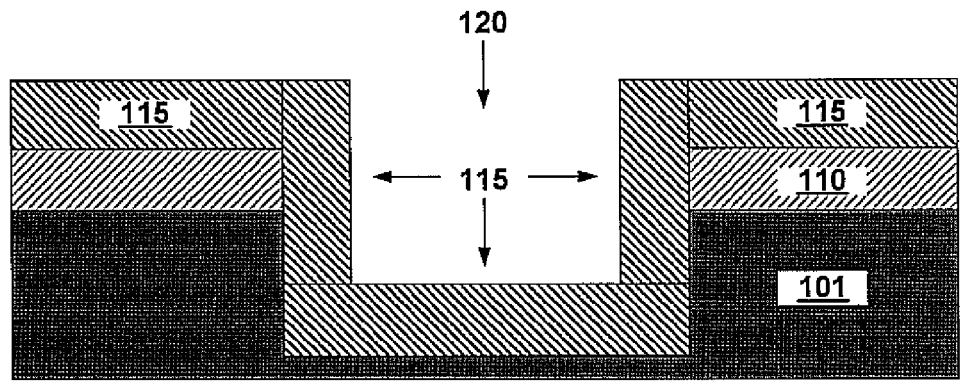

FIG. 2 illustrates a side sectional view of a wafer in an intermediate stage of forming a narrow trench, in accordance with embodiments of the present invention. FIG. 2 illustrates a trench 120, formed via conventional trench etching techniques, through first insulating layer 110 and into substrate 101. In general, the depth of trench 120 is a function of the design of the semiconductor device utilizing the trench.

After formation of the trench 120, a second insulating film 115 is deposited or grown on all the exposed surfaces. For example, second insulating film 115 is deposited or grown on top of first insulating layer 110 and on the walls and bottom of trench 120.

Figure 3:
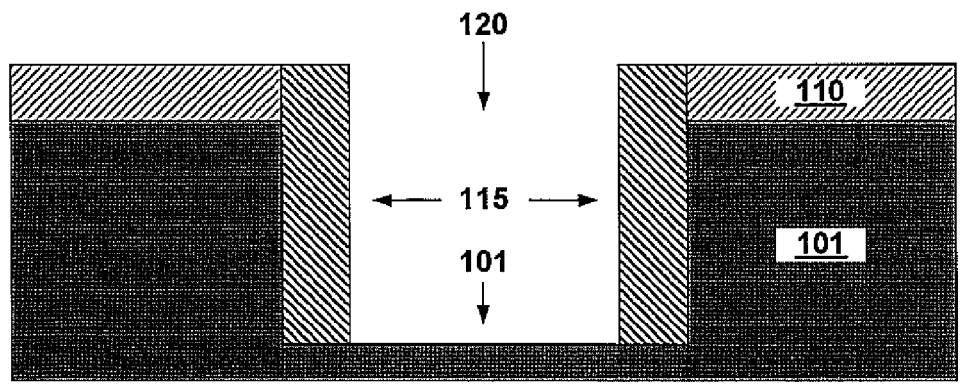

FIG. 3 illustrates a side sectional view of a wafer in an intermediate stage of forming a narrow trench, in accordance with embodiments of the present invention. FIG. 3 illustrates the trench structure after second insulating film 115 has been removed from the top and bottom of trench 120 via a blanket dry etching process.

Figure 4:
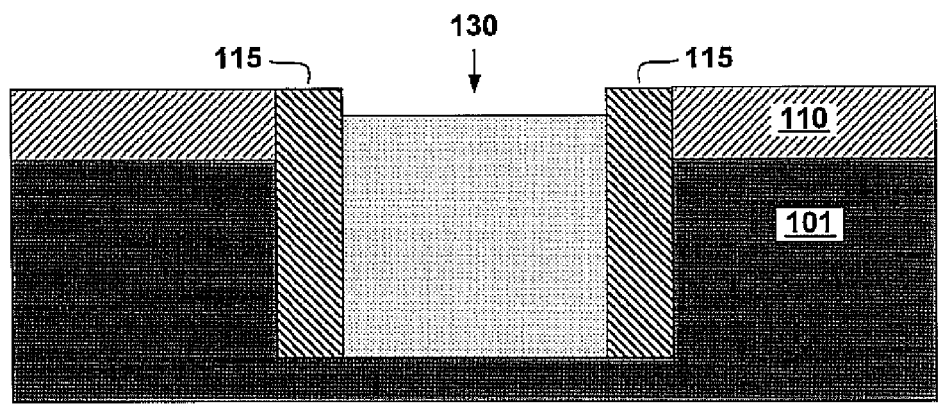

FIG. 4 illustrates a side sectional view of a wafer in an intermediate stage of forming a narrow trench, in accordance with embodiments of the present invention. FIG. 4 illustrates the trench 120 filled with crystal epitaxial fill 130 via a selective epitaxial growth process. Embodiments in accordance with the present invention are well suited to an epitaxial fill 130 comprising n-type or p-type doped or undoped material. Epitaxial fill 130 should be grown up to at least to the bottom of first insulating layer 110.

Figure 5:
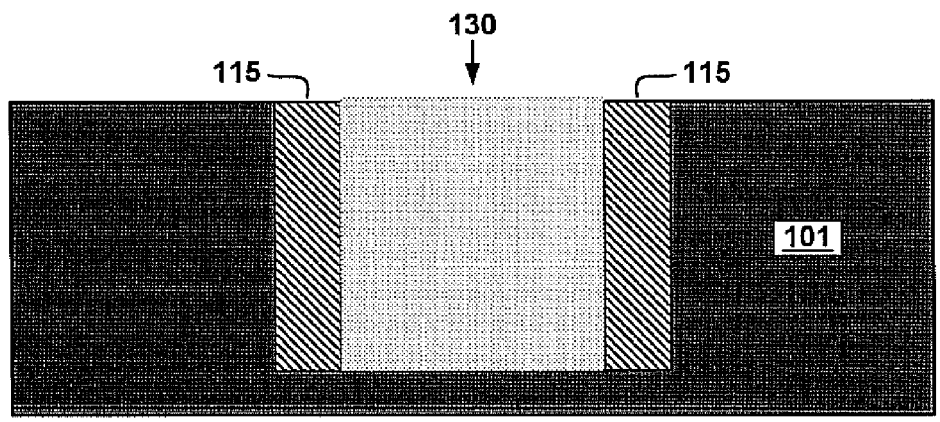

FIG. 5 illustrates a side sectional view of a silicon wafer in an intermediate stage of forming a narrow trench, in accordance with embodiments of the present invention. FIG. 5 illustrates the trench 120 after a chemical mechanical polishing operation has removed remaining portions of first insulating layer 110.

Figure 6:
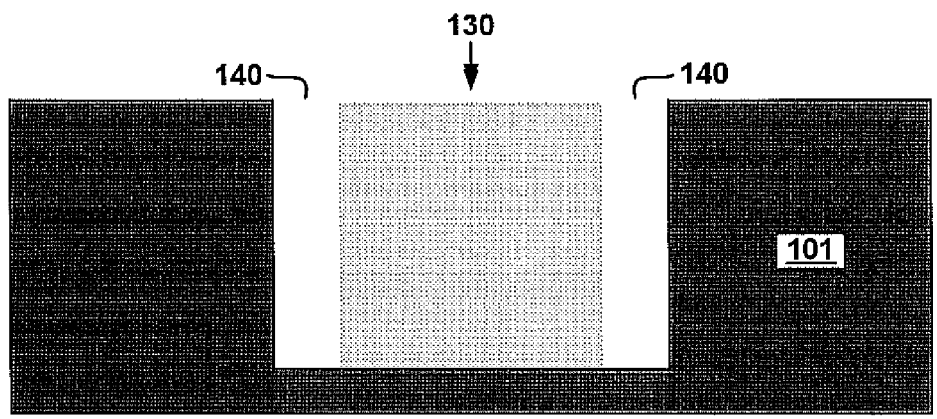

FIG. 6 illustrates a side sectional view of a wafer in an intermediate stage of forming a narrow trench, in accordance with embodiments of the present invention. FIG. 6 illustrates the fill 130 after an etching operation has removed remaining portions of second insulating layer 115 (FIG. 5).

It is to be appreciated that the removal of second insulating material 115 (FIG. 5) along the side portions of fill 130 produces narrow trenches 140, in accordance with embodiments of the present invention.

Figure 7:
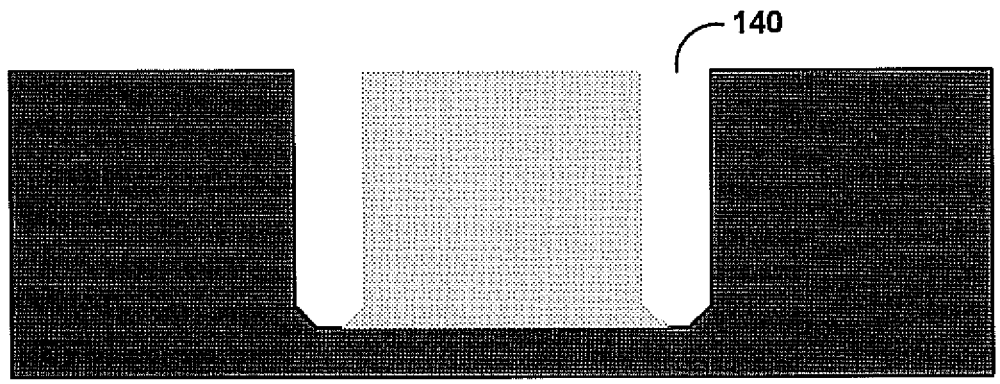
FIG. 7 illustrates a side sectional view of a wafer with a completed narrow trench, in accordance with embodiments of the present invention.

FIG. 7 illustrates a side sectional view of a wafer with a completed narrow trench, in accordance with embodiments of the present invention. FIG. 7 illustrates narrow trenches 140 after a high temperature anneal operation in a Hydrogen-ambient atmosphere has smoothed out the trench corners and/or surface.

It is to be appreciated insulating material 115 can generally be formed to a thickness that is much thinner, e.g., smaller, than a critical dimension of a semiconductor process. Consequently, trenches formed in semiconductors in accordance with embodiments of the present invention can be thinner (narrower) than a critical dimension of the semiconductor process utilized to create the semiconductor. For example, prototype trenches of 200 Å to 300 Å wide have been constructed utilizing a 1.0-micron process. Simulation results predict that trenches less than about 100 Å wide may be fabricated in this manner. Such trenches can be excess of 1000 times smaller than the process critical dimension.

Figure 8:
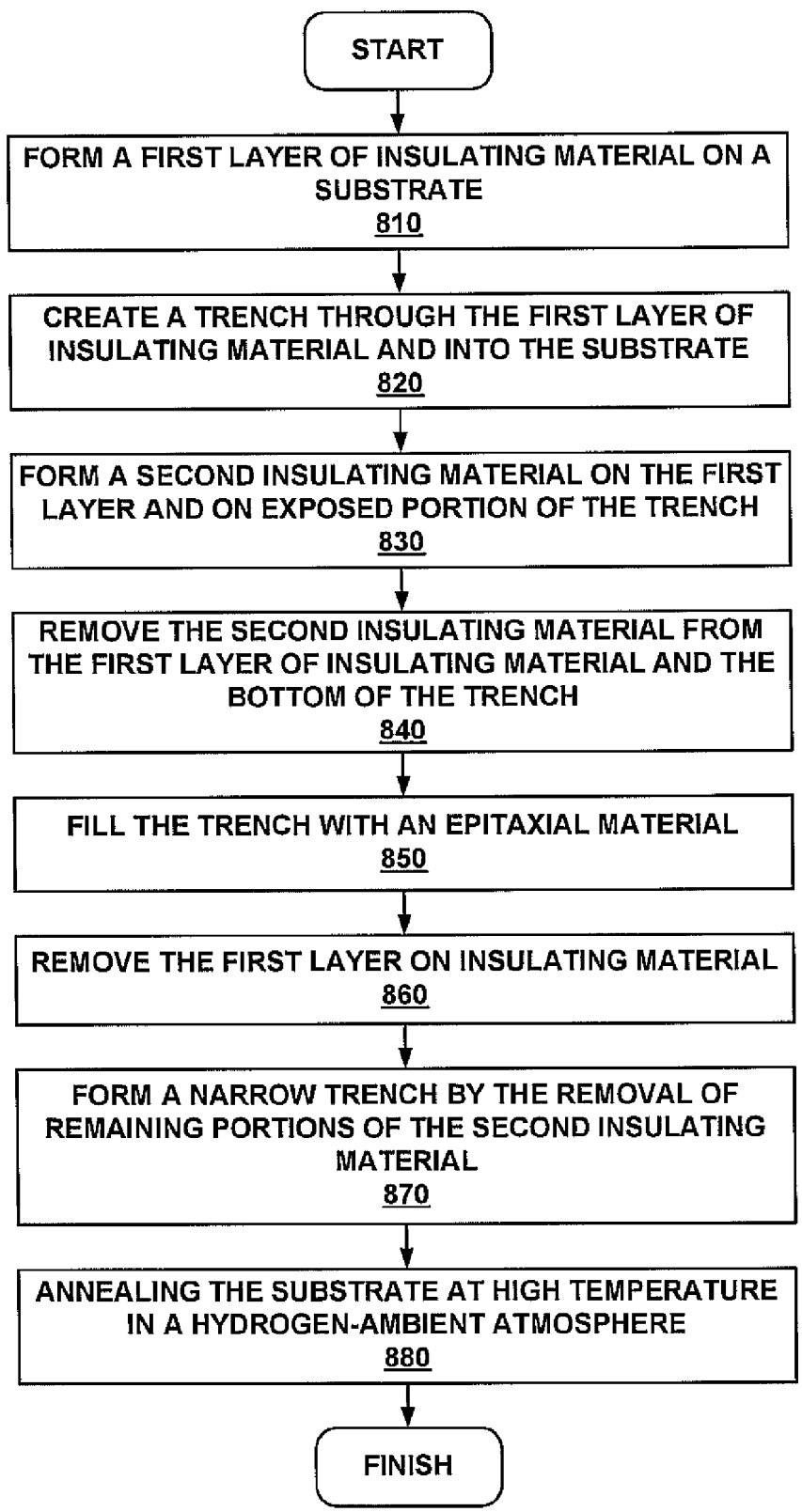
FIG. 8 illustrates a method of forming a narrow trench, in accordance with embodiments of the present invention.

FIG. 8 illustrates a semiconductor manufacturing process 800 of forming a narrow trench, in accordance with embodiments of the present invention. In 810, a first layer of insulating material is formed on a substrate. The insulating material may be deposited, e.g., PECVD, or thermally grown.

In 820, a trench is created through the first layer of insulating material and into the substrate. In 830, a second insulating material is formed on the first layer and on exposed portions of the trench.

In 840, the second insulating material is removed from the first layer of insulating material and the bottom of the trench, for example, via a blanket dry etching process.

In 850, the trench is filled with an epitaxial material, for example via a selective epitaxial growth process. In 860, the first layer of insulating material is removed, for example via a chemical mechanical polishing process.

In 870, a narrow trench is formed by the removal of the remaining portions of the second insulating material.

In optional 880, a high temperature anneal is conducted in a Hydrogen-ambient atmosphere to smooth the trench surface.

While the method of the embodiment illustrated in flow chart 800 shows specific sequences and quantity of operations, the present invention is suitable to alternative embodiments. For example, not all the operations provided for in the methods are required for the present invention. Furthermore, additional operations can be added to the operations presented in the present embodiment. Likewise, the sequences of operations can be modified depending upon the application.

In this novel manner, a narrow trench having a width very much less than a critical dimension of a semiconductor process can be formed. Such narrow trenches advantageously increase density of vertical channel semiconductors as well as beneficially decrease on resistance of such devices, e.g., in vertical power metal oxide semiconductors (MOSFETs).

Thus, embodiments in accordance with the present invention provide systems and methods for narrow semiconductor trench structures. Additionally, in conjunction with the aforementioned benefit, embodiments of the present invention provide systems and methods for narrow semiconductor trench structures that enable constructing trenches having a width very much less than a critical dimension of a semiconductor process. As a further benefit, in conjunction with the aforementioned benefits, systems and methods of narrow semiconductor trench structures are provided in a manner that is compatible and complimentary with existing semiconductor processing systems and manufacturing processes.

Embodiments in accordance with the present invention, narrow semiconductor trench structure, are thus described. While the present invention has been described in particular embodiments, it should be appreciated that the present invention should not be construed as limited by such embodiments, but rather construed according to the below claims.

What is claimed is:

1. A semiconductor fabrication method for forming a narrow trench, said method comprising:
   forming a first layer of insulating material on a substrate;
   creating a trench through the first layer of insulating material and into the substrate;
   forming a second insulating material on the first layer and on exposed portions of the trench;
   removing the second insulating material from the first layer of insulating material and the bottom of the trench;
   filling the trench with an epitaxial material;
   removing the first layer of insulating material; and
   forming a narrow trench by the removal of remaining portions of the second insulating material.

2. The method of claim 1 wherein said forming a first layer of insulating material comprises growing said first layer of insulating material.

3. The method of claim 1 wherein said forming a second insulating material comprises growing said second insulating material.

4. The method of claim 1 wherein said removing the second insulating material comprises applying a blanket dry etching process.

5. The method of claim 1 wherein said filling comprises growing epitaxial material.

6. The method of claim 1 wherein said removing the first layer of insulating material comprises applying chemical mechanical polishing.

7. The method of claim 1 further comprising annealing the substrate at high temperature in a Hydrogen-ambient atmosphere.

\* \* \* \* \*